United States Patent
Hartman et al.

(10) Patent No.: US 6,829,138 B2
(45) Date of Patent: Dec. 7, 2004

(54) ENCLOSURE APPARATUS FOR ELECTRICAL EXCITATION EQUIPMENT AND OTHER APPLICATIONS

(75) Inventors: Reid K. Hartman, Hendersonville, NC (US); C. Richard Mummert, Hendersonville, NC (US)

(73) Assignee: Eaton Corporation, Cleveland, OH (US)

( * ) Notice: Subject to any disclaimer, the term of this patent is extended or adjusted under 35 U.S.C. 154(b) by 164 days.

(21) Appl. No.: 10/325,560

(22) Filed: Dec. 20, 2002

(65) Prior Publication Data

US 2004/0120122 A1 Jun. 24, 2004

(51) Int. Cl.[7] ................................................ H01R 9/00
(52) U.S. Cl. .................... 361/679; 361/727; 312/223.4; 248/921
(58) Field of Search ................................. 361/679–687, 361/724–727; 312/223.1–223.6; 248/917–923; 439/61; 206/611, 313

(56) References Cited

U.S. PATENT DOCUMENTS

| | | | |
|---|---|---|---|
| 4,306,658 A | 12/1981 | Montealegre | 206/611 |
| 4,620,630 A | 11/1986 | Moss | 206/313 |
| 5,381,890 A | 1/1995 | Scobbie | 206/45.23 |
| 5,833,117 A | 11/1998 | Kovens et al. | 221/24 |
| 6,222,725 B1 * | 4/2001 | Jo | 361/683 |
| 6,234,592 B1 * | 5/2001 | Liu et al. | 312/223.2 |
| 6,242,691 B1 * | 6/2001 | Reese et al. | 174/35 R |

* cited by examiner

Primary Examiner—Hung Van Duong
(74) Attorney, Agent, or Firm—Martin J. Moran

(57) ABSTRACT

An improved enclosure apparatus that can be used in conjunction with electrical excitation apparatus or other equipment is convertible between a rack-mountable configuration and a wall-mountable configuration. The enclosure apparatus includes a housing having first and second walls. A user interface is securable to the first wall when the enclosure apparatus is in the rack-mountable configuration and is securable to the second wall when the enclosure apparatus is in the wall-mountable configuration. The enclosure apparatus may additionally include a console apparatus having a console wall that protrudes outwardly from the second wall and to which the user interface can be secured.

20 Claims, 9 Drawing Sheets

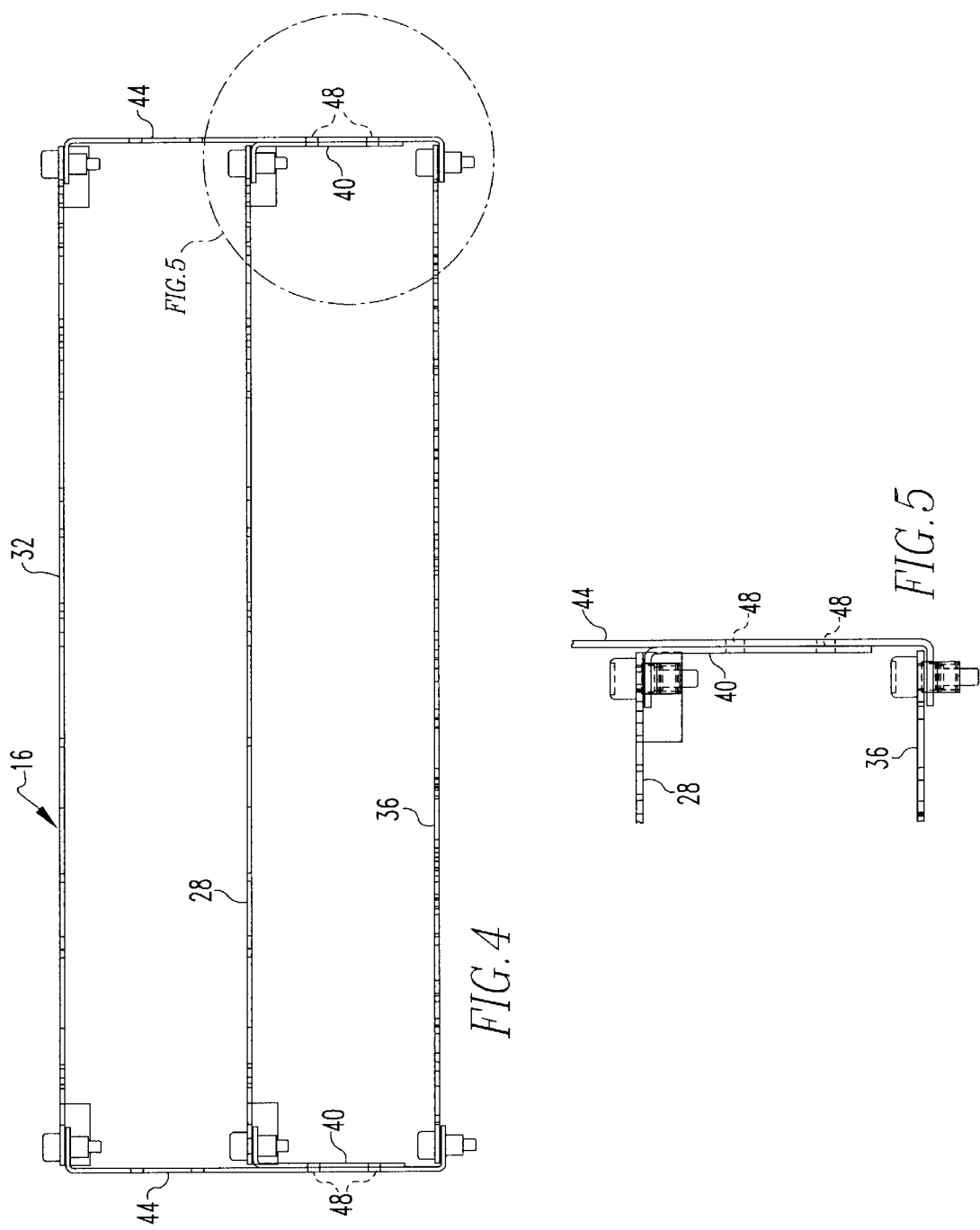

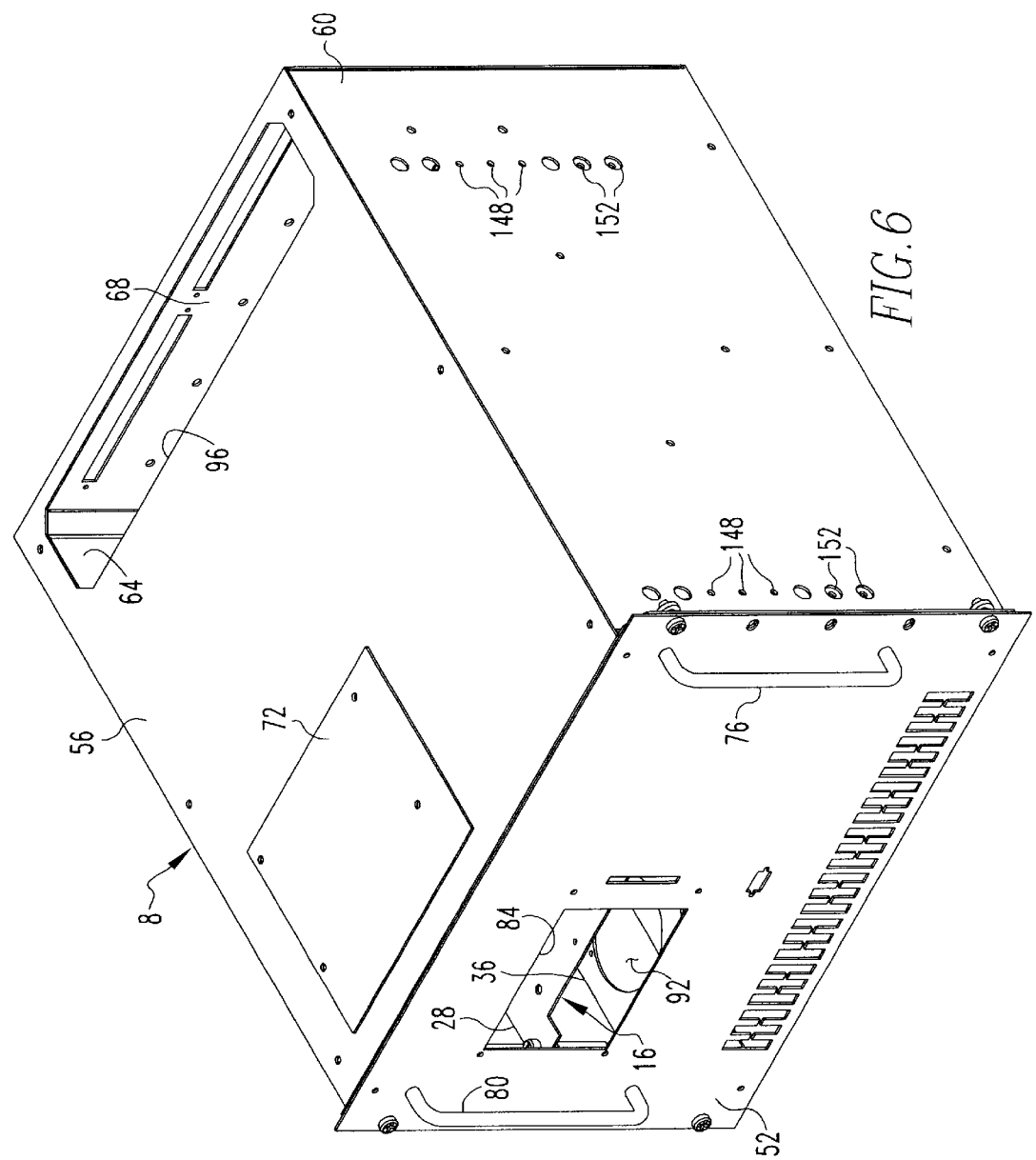

ENCLOSURE APPARATUS FOR ELECTRICAL EXCITATION EQUIPMENT AND OTHER APPLICATIONS

BACKGROUND OF THE INVENTION

1. Field of the Invention

The present invention relates generally to electrical equipment and, more particularly, to an enclosure apparatus for electrical equipment that is convertible between a rack-mountable configuration and a wall-mountable configuration.

2. Description of the Related Art

It is known that numerous types of electrical equipment exist in the form of various electrical components that are mounted within or onto an enclosure to form a discrete piece of equipment. Depending upon the nature of the piece of equipment, it may be desirable to mount the piece of equipment in a known rack or onto a vertical support structure such as a wall, although other electrical equipment can be mounted in numerous different fashions or simply placed onto a floor. As example of such electrical equipment would include electrical excitation equipment which typically is mounted on a rack or onto a wall of some type.

As is known in the relevant art, a rack of the aforementioned type typically includes a vertically extending frame disposed within a cabinet, with the frame being configured to have mounted thereto a number of pieces of electrical equipment of a given width. Such pieces of equipment typically are stacked vertically within the rack, one on top of another. In order for a piece of equipment to be rack mountable, the piece of equipment typically will include a housing of the aforementioned given width and will include one or more handles on a front panel thereof to enable the piece of equipment to be pushed and pulled in a horizontal plane into and out of the rack for installation and removal as needed. The piece of equipment typically will also include a front flange that is slightly wider than the given width of the housing, with the flange then being fastened to the vertical frame members of the rack.

In order for a piece of equipment to be mounted onto a vertical support structure such as a wall, the piece of equipment typically must include some type of outwardly-extending flange or other strut or support that enables the piece of equipment to be fastened to the vertical support structure.

Due to the wide range of mounting possibilities and the potential need for existing equipment to be remounted in different fashions as a result of upgrades and other activities, it would be desirable for a piece of electrical equipment to be mountable in different configurations, such as being rack-mountable and wall-mountable. Such a piece of equipment may include an enclosure apparatus that is configurable for mounting in a plurality of orientations, such as would permit the enclosure apparatus to be both rack-mountable and wall-mountable, and may be convertible between a rack-mountable configuration and a wall-mountable configuration.

SUMMARY OF THE INVENTION

An improved enclosure apparatus in accordance with the present invention meets these and other needs. An improved enclosure apparatus that can be used in conjunction with electrical excitation apparatus or other equipment is convertible between a rack-mountable configuration and a wall-mountable configuration. The enclosure apparatus includes a housing having first and second walls. A user interface is securable to the first wall when the enclosure apparatus is in the rack-mountable configuration and is securable to the second wall when the enclosure apparatus is in the wall-mountable configuration. The enclosure apparatus may additionally include a console apparatus having a console wall that protrudes outwardly from the second wall and to which the user interface can be secured.

Accordingly, an aspect of the present invention is to provide an improved enclosure apparatus that can be converted between a rack-mountable configuration and a wall-mountable configuration.

Another aspect of the present invention is to provide an improved enclosure apparatus having a housing including first and second walls, the enclosure apparatus further including a user interface that can alternatively be mounted on either the first and second walls to convert the enclosure apparatus between a rack-mountable and a wall-mountable apparatus, respectively.

Another aspect of the present invention is to provide an improved enclosure apparatus having a user interface and being capable of wall mounting at different vertical positions without impairing the functionality of the user interface.

Another aspect of the present invention is to provide an improved enclosure apparatus having first and second walls and a user interface and that can additionally receive a console apparatus that permits the user interface to be mounted to protrude outwardly from the second wall at an angle thereto.

Another aspect of the present invention is to provide an improved enclosure apparatus having first and second walls with first and second holes formed therein, respectively, and further including a cover plate that can alternatively be mounted over the first and second holes depending upon whether the enclosure apparatus is configured for rack mounting or for wall mounting.

Another aspect of the present invention is to provide an improved enclosure apparatus having a housing and an internal support, the internal support being disposed within the interior of the housing, with the enclosure apparatus further including an external support that can be employed depending upon whether the enclosure apparatus is in a rack-mountable configuration or a wall-mountable configuration.

Another aspect of the present invention is to provide an improved enclosure apparatus having a user interface, a cover plate, and a pair of handles that can be mounted in different configurations depending upon whether the enclosure apparatus is to be rack mounted or wall mounted.

Accordingly, an aspect of the present invention is to provide an improved enclosure apparatus for electrical equipment that is configurable for mounting in a plurality of orientations, in which the general nature of the enclosure apparatus can be stated as including a housing having an interior, an internal support disposed at the interior of the housing, and a user interface, the housing including a first wall and a second wall, the user interface being alternatively securable to the first and second walls, the user interface being secured to the first wall when the enclosure apparatus is configured to be mountable in a first orientation, and the user interface being secured to the second wall when the enclosure apparatus is configured to be mountable in a second orientation.

The housing may include a handle and a third wall, with the handle being alternatively securable to the first wall and to at least one of the second and third walls, with the handle being secured to the first wall when the enclosure apparatus is configured to be mountable in the first orientation, and with the handle being secured to one of the second and third walls when the enclosure apparatus is configured to be mounted in the second orientation. The housing may include a console member that is securable to the second wall when the enclosure apparatus is configured to be mountable in the second orientation, with the console member including a console wall oriented generally non-parallel with the second wall, and with the user interface being mounted on the console wall when the enclosure apparatus is configured to be mountable in the second orientation.

Another aspect of the present invention is to provide an improved enclosure apparatus for electrical equipment that is convertible between a plurality of mounting configurations, in which the general nature of the enclosure apparatus can be generally stated as including a housing having an interior, an internal support mounted to the housing and disposed within the interior of the housing, and a user interface, the housing including a first wall and a second wall, the user interface being alternatively securable to the first and second walls, the user interface being secured to the first wall when the enclosure apparatus is in a rack-mountable configuration, and the user interface being secured to the second wall when the enclosure apparatus is in a wall-mountable configuration.

The housing may include a pair of third walls, with the internal support including a first support plate, a second support plate, a plurality of first brackets, and a plurality of second brackets, with the first support plate being secured to the first brackets, the second support plate being secured to the second brackets, the first brackets being secured to the second brackets, and the second brackets being secured to the third walls.

Another aspect of the present invention is to provide an improved excitation apparatus, the general nature of which can be stated as including a housing having an interior, an internal support mounted to the housing and disposed within the interior of the housing, a number of electrical components secured to the internal support, and a user interface secured to the housing, the housing including a first wall and a second wall, the user interface being alternatively securable to the first and second walls, the excitation apparatus being convertible between a rack-mountable configuration and a wall-mountable configuration, the user interface being secured to the first wall when the excitation apparatus is in the rack-mountable configuration, and the user interface being secured to the second wall when the excitation apparatus is in the wall-mountable configuration.

BRIEF DESCRIPTION OF THE DRAWINGS

A further understanding of the invention can be gained from the following Description of the Preferred Embodiments when read in conjunction with the accompanying drawings in which:

FIG. 4 is a front elevational view of the internal support;

FIG. 5 is an enlarged view of a portion of FIG. 4;

FIG. 6 is an isometric view of the housing and the internal support of the enclosure apparatus of FIG. 1;

Similar numerals refer to similar parts throughout the specification.

DESCRIPTION OF THE PREFERRED EMBODIMENTS

Figure 1:
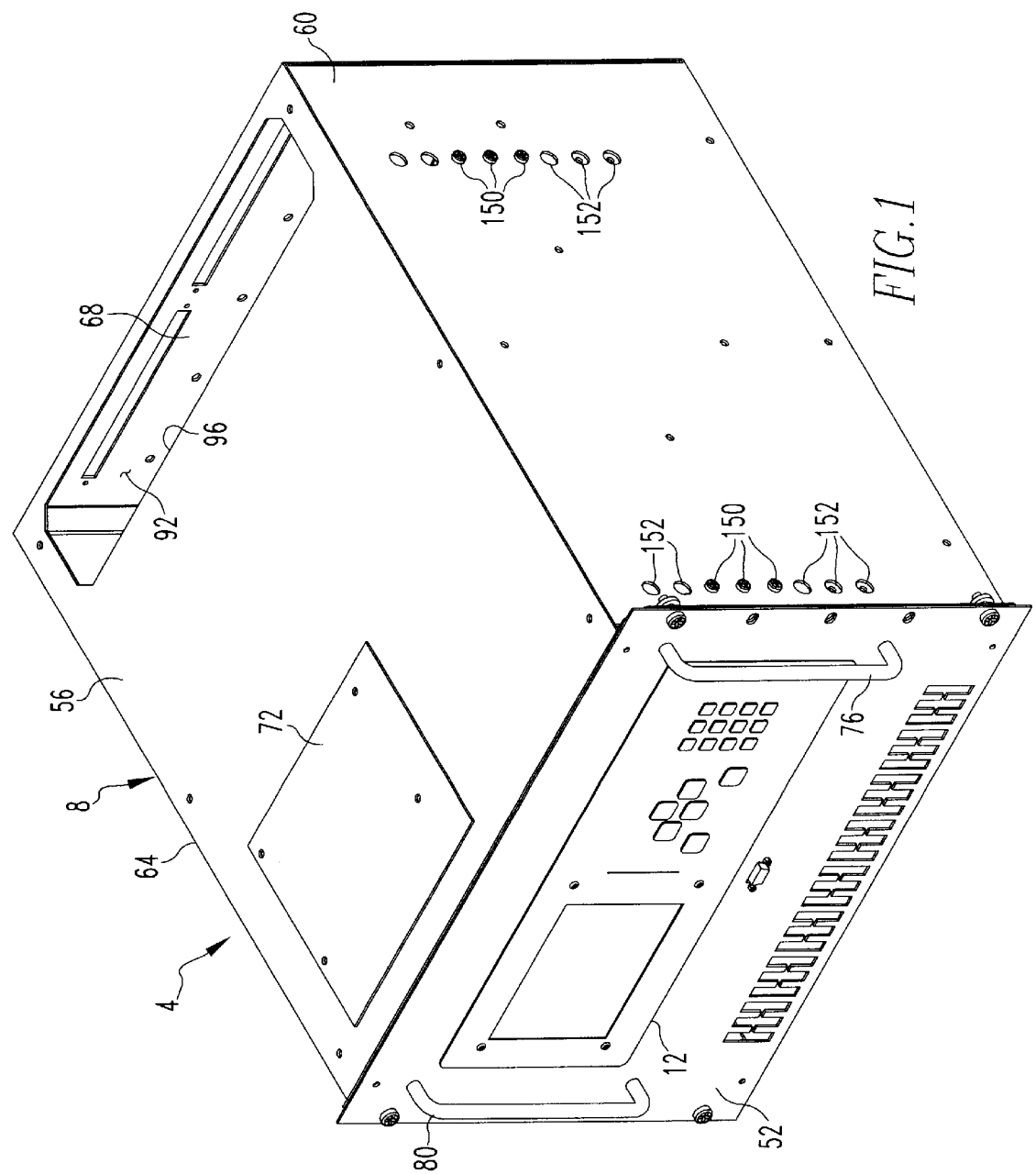
FIG. 1 is an isometric view of an improved enclosure apparatus in accordance with the present invention that is configured to be rack-mountable.

An improved enclosure apparatus 4 in accordance with the present invention is indicated generally in FIG. 1. It is noted that the exemplary enclosure apparatus 4 is a piece of electrical excitation apparatus, although it is also noted that the improved enclosure apparatus 4 can be employed in numerous other applications. It is further noted that the enclosure apparatus 4 of FIG. 1 is in a rack-mountable configuration.

Figure 2:
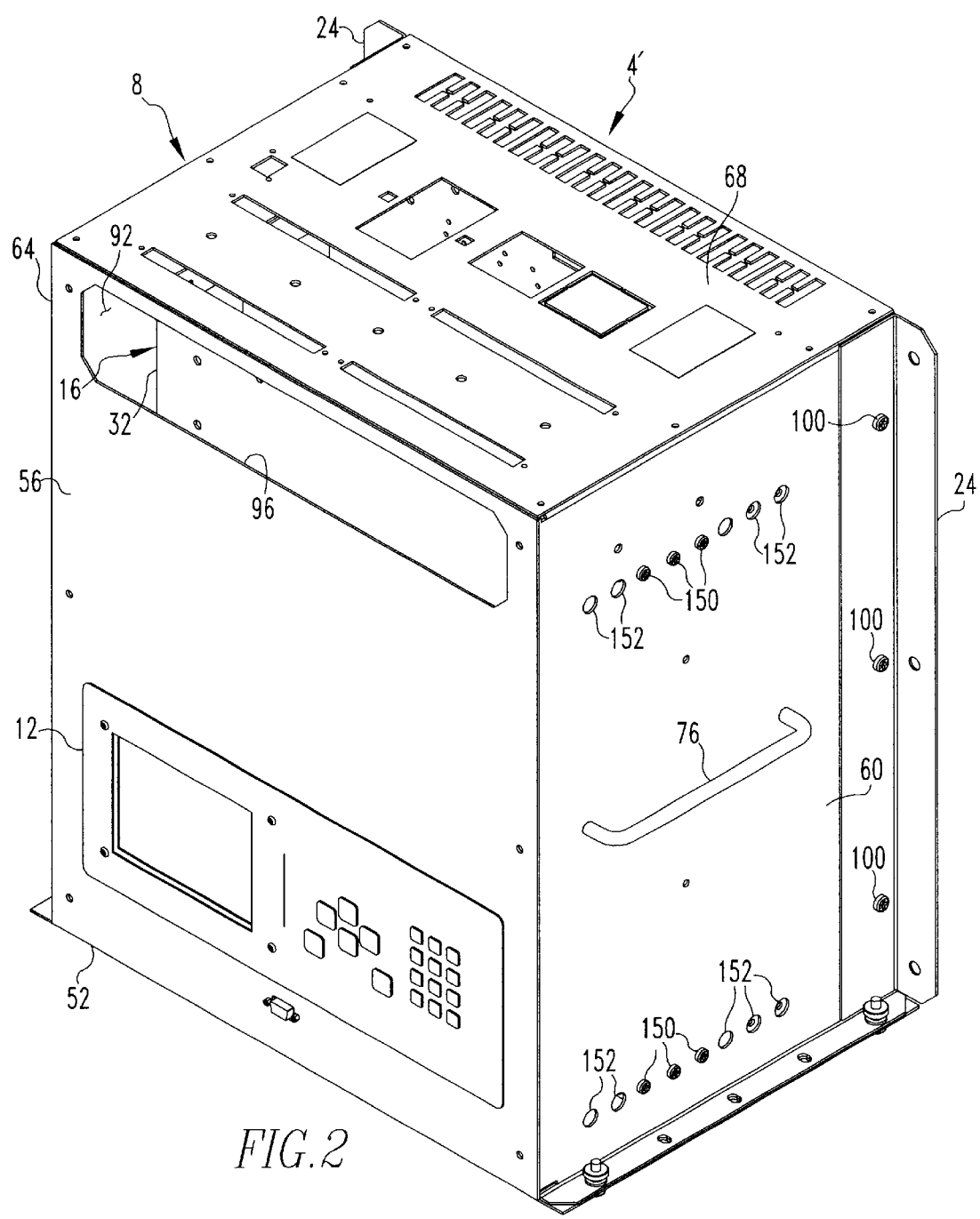
FIG. 2 is an isometric view of the enclosure apparatus of FIG. 1 configured to be wall-mountable.

In accordance with an aspect of the present invention, the enclosure apparatus 4 is convertible from the rack-mountable configuration of FIG. 1 into an enclosure apparatus 4' as is depicted in FIG. 2 that is in a wall-mountable configuration, and vice-versa. The enclosure apparatus 4 can be converted between the rack-mountable configuration (FIG. 1) and the wall-mountable configuration (the enclosure apparatus 4' of FIG. 2) substantially by changing the positions of some of the components thereof and by rotating the device 90°. It is noted that the enclosure apparatus 4' employs an additional component not used in the enclosure apparatus 4, as will be set forth more fully below. Hereafter, the rack-mountable configuration of the enclosure apparatus 4 and the wall-mountable configuration thereof will be referred to by the same numeral 4 instead of by the separate designations 4 and 4'.

Figure 3:
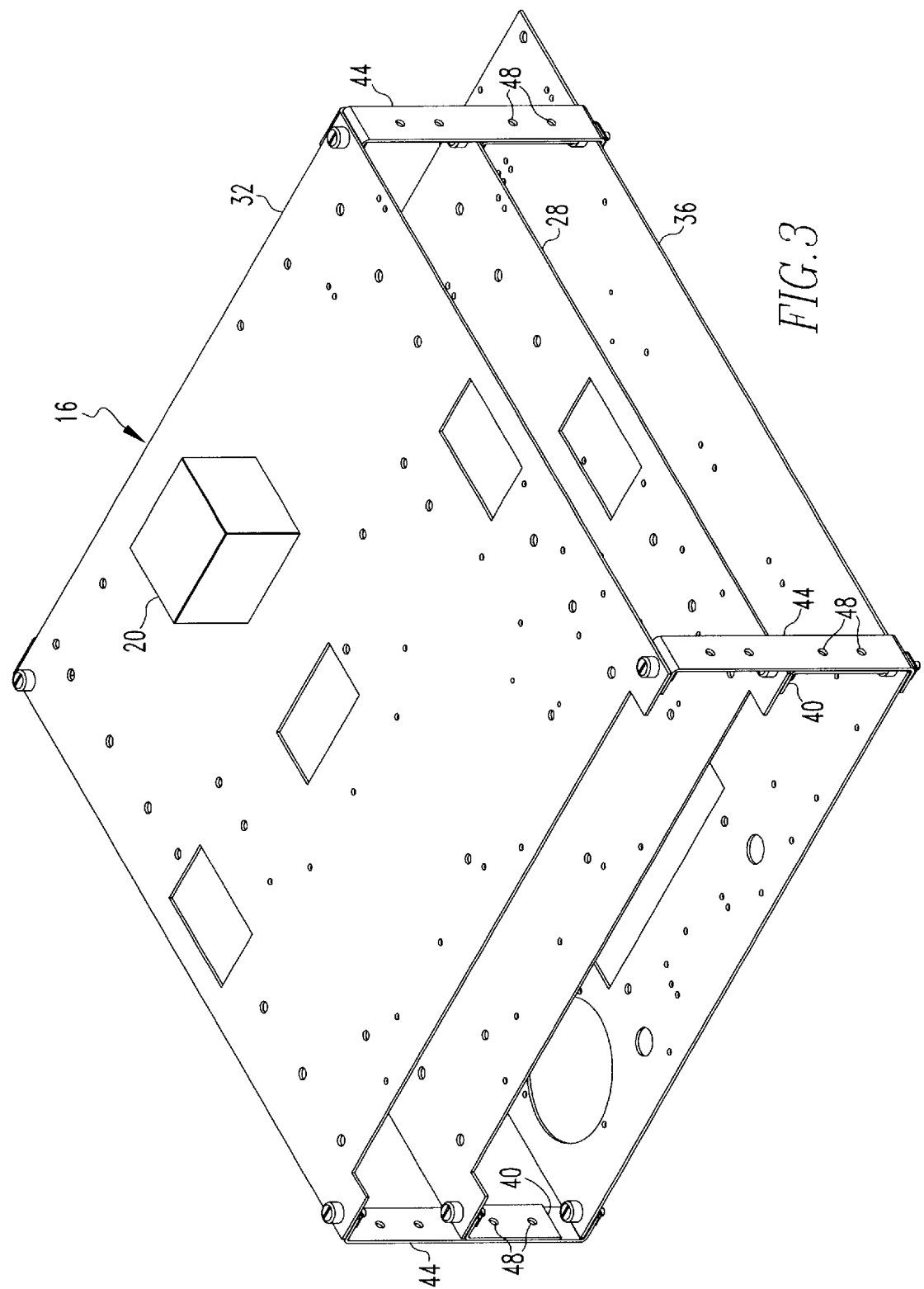
FIG. 3 is an isometric view of an internal support of the enclosure apparatus upon which is secured a schematically-depicted electrical component.

The enclosure apparatus 4 includes a housing 8, a user interface 12, an internal support 16 (FIG. 3) and a number of electrical components that are depicted schematically at the numeral 20 in FIG. 3. As used herein, the expression "a number of" and variations thereof shall be construed broadly to refer to any non-zero quantity. The electrical components 20 can be substantially any type of electrical components that are appropriate to the function of the enclosure apparatus whether or not it is employed in conjunction with the exemplary electrical excitation apparatus. As suggested above, when the enclosure apparatus 4 is employed in the wall-mounted configuration (as is shown at the numeral 4' in FIG. 2) the enclosure apparatus 4 additionally includes a pair of external supports 24 that are generally angled in cross section.

As can be understood from FIGS. 3–5, the internal support 16 includes a first support plate 28, a pair of second support plates 32 and 36, a plurality of first brackets 40, and a plurality of second brackets 44. The first and second plates 28, 32, and 36 are oriented generally parallel with one another, with the first support plate 28 being disposed between the second support plates 32 and 36. It can be seen that the first and second support plates 28, 32, and 36 are formed with a plurality of fasteners holes and the like for mounting the electrical components 20 thereto. It is further noted that the internal support 16 potentially could be defined as one or more interior surfaces of the housing 8.

The second brackets 44 are generally U-shaped, and the second support plates 32 and 36 are mounted with appropriate fasteners on the opposed ears of the second brackets 44. The first brackets 40 are generally angled in shape. The first support plate 28 is mounted the first brackets 40, and the first brackets 40 are mounted to the second brackets 44 with appropriate fasteners (not shown) employed at a plurality of first fastening points 48. The fasteners employed could include any of a wide variety of known fasteners such as bolts, screws, rivets, and the like.

As can be understood from FIG. 6, the housing 8 includes a first wall 52, a second wall 56, a pair of third walls 60 and 64, and a fourth wall 68. The housing 8 additionally includes a fifth wall (not shown) opposite the second wall 56.

The housing 8 further includes a cover plate 72 and a pair of handles 76 and 80. A generally rectangular first hole 84 (FIG. 6) is formed in the first wall 52, and a generally rectangular second hole 88 (FIG. 7) is formed in the second wall 56.

In the rack-mountable configuration depicted generally in FIG. 6, the cover plate 72 is secured to the second wall 56, and the handles 76 and 80 are secured to the first wall 52. Specifically, in the rack-mountable configuration the cover plate 72 is disposed over the second hole 88.

Figure 7:
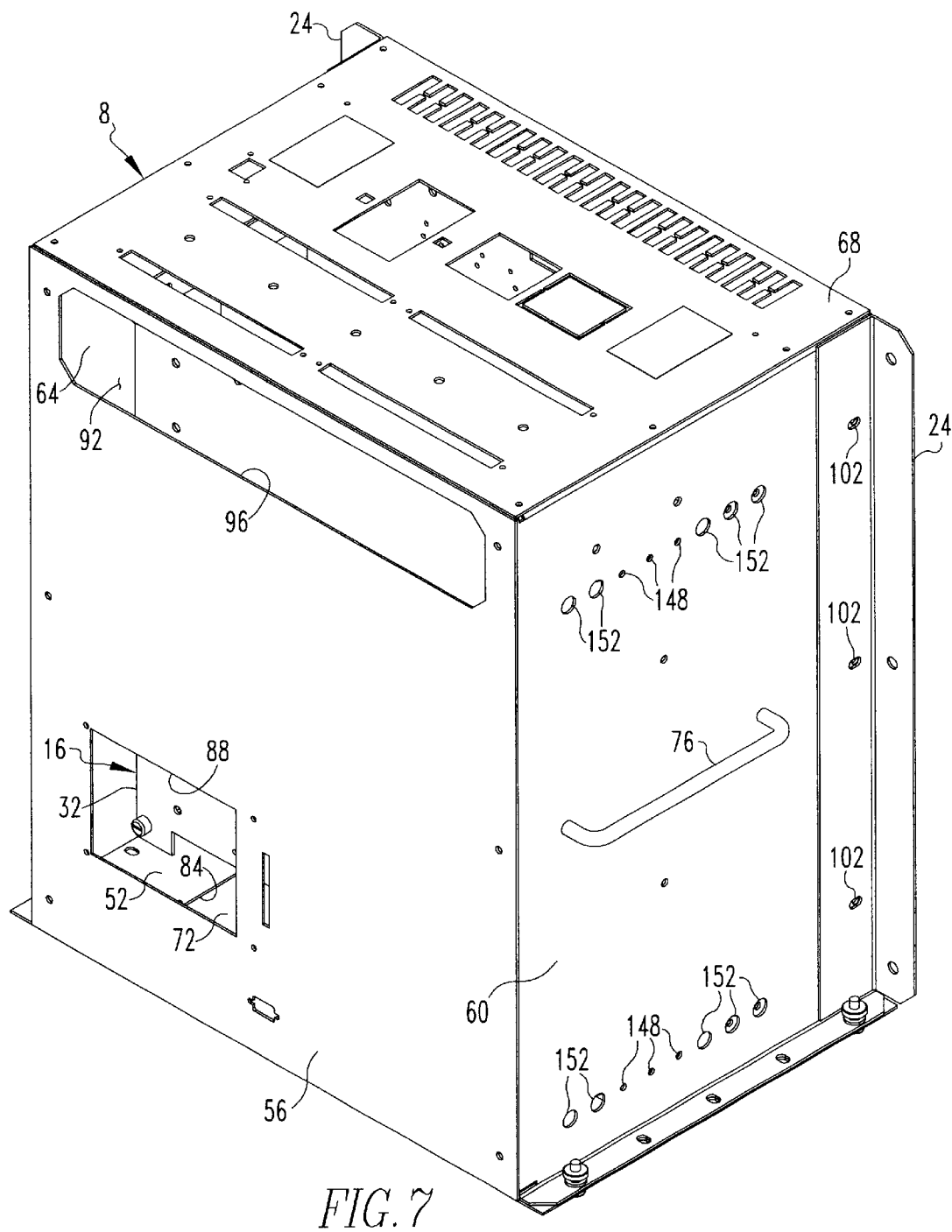
FIG. 7 is an isometric view of the housing and the internal support of the enclosure apparatus of FIG. 2.

In the wall-mountable configuration of FIG. 7, however, the cover plate 72 is disposed atop and covers the first hole 84. Moreover, the handle 76 is mounted on the third wall 60, and the handle 80 (not depicted in FIG. 7) is mounted on the third wall 64 when the enclosure apparatus 4 is in the wall-mountable configuration. The external supports 24 are secured to the third walls 60 and 64 with appropriate fasteners 100 employed at a number of second fastening points 102 (FIG. 7) when the enclosure apparatus 4 is employed in the wall-mountable configuration. The external supports 24 are not employed in the rack-mountable configuration.

The housing 8 includes an interior 92 within which the internal support 16 is disposed. The second wall 56 includes an elongated opening 96 formed therein that provides access to the interior 92 as well as permits additional ventilation of the interior 92. A louvered panel (not shown) may be provided for mounting to the second wall 56 to cover the opening 96.

The user interface 12 (FIGS. 1 and 2) can be any type of mechanical, visual, audible, electrical, or other type of system that permits a user such as a technician to interface or interact in some fashion with the enclosure apparatus 4, such as to control or observe the operation of the device that incorporates the enclosure apparatus 4 such as the exemplary excitation apparatus of FIGS. 1 and 2. In the rack-mountable configuration (FIG. 1) the user interface 12 is mounted on the first wall 52 and extends across substantially the entirety of the first hole 84. In the wall-mountable configuration (FIG. 2) the user interface 12 is secured to the second wall 56 and extends across substantially the entirety of the second hole 88. The cover plate 72 is disposed over the second hole 88 when the user interface 12 is disposed over the first hole 84, i.e., the rack-mountable configuration, and the cover plate 72 is disposed over the first hole 84 when the user interface 12 is disposed over the second hole 88, i.e., the wall-mountable configuration. It is noted that the user interface 12 is depicted schematically herein, and in actual operation typically may additionally include other components extending into the interior 92 of the housing 8.

Figure 9:
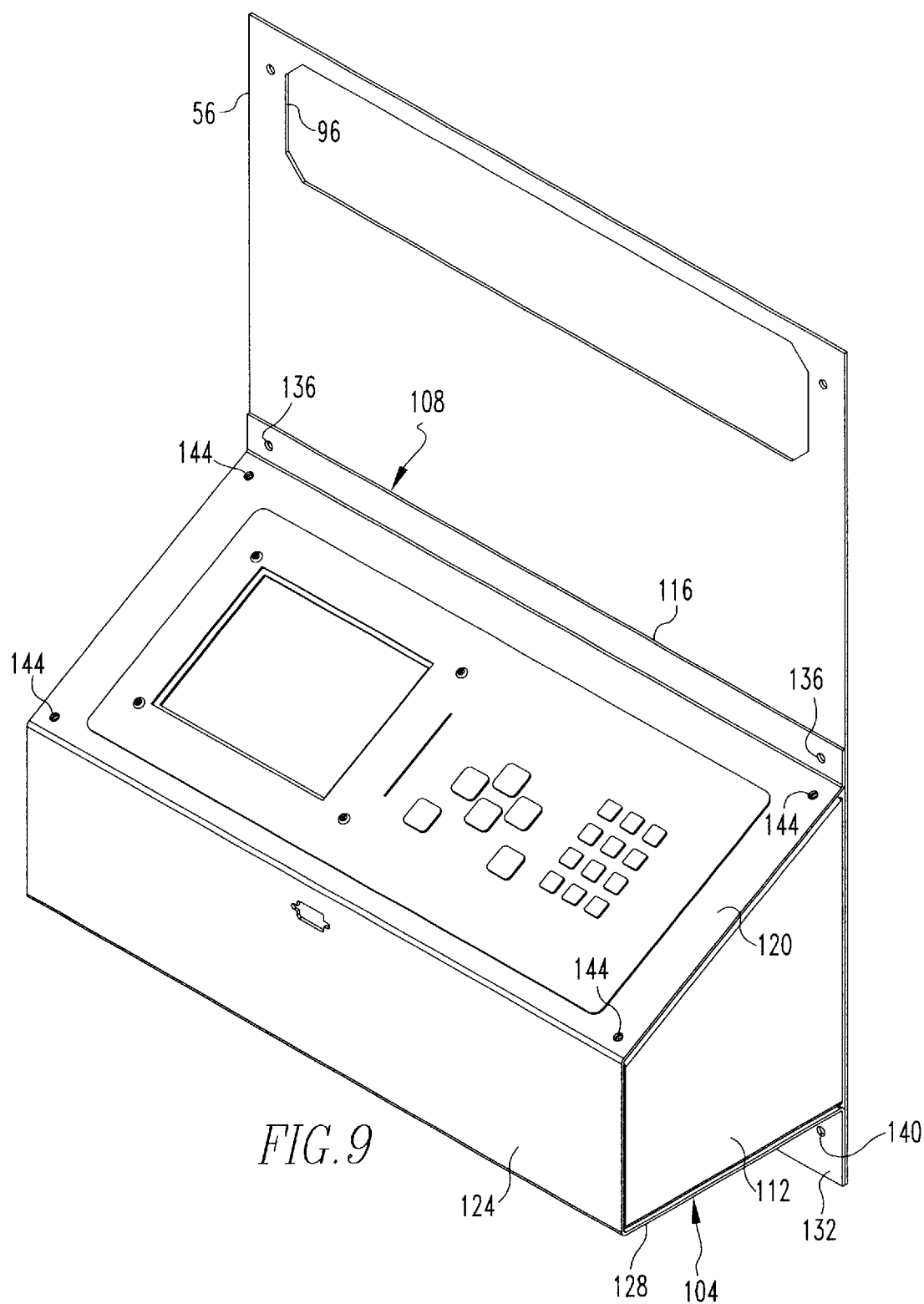
FIG. 9 is an isometric view of a console apparatus in accordance with the present invention mounted on a wall of the enclosure apparatus of FIG. 2.
Figure 10:
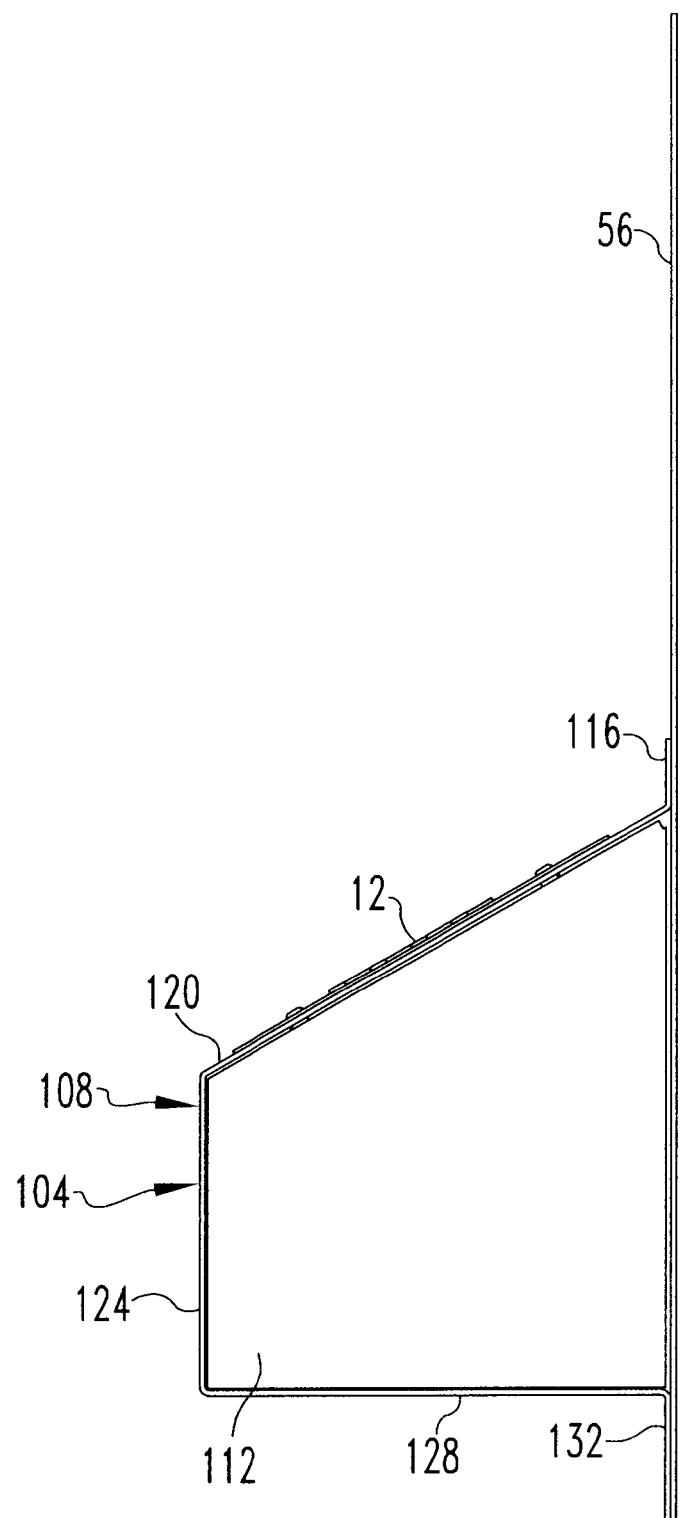
FIG. 10 is a side elevational view of the console apparatus and wall of FIG. 9.

As can be seen in FIGS. 9 and 10, the user interface 12 can additionally be mounted onto a console apparatus 104 that can be secured to the second wall 56 when the enclosure apparatus 4 is in the wall-mountable configuration. The use of the console apparatus 104 for mounting the user interface 12 is particularly useful when the enclosure apparatus 4 is mounted at a relatively low vertical position at which the user interface 12, if oriented vertically, would be inconvenient to use by an operator or technician. By providing the console apparatus 104, the enclosure apparatus 4 can be installed at relatively lower positions than would otherwise be appropriate. It is also noted that the console apparatus 104 can be employed when the enclosure apparatus 4 is in configurations other than the wall-mountable configuration.

The console apparatus includes a console member 108 and a pair of side plates 112. The console member 108 is securable onto the second wall 56, and the side plates 112 are mountable onto the console member 108.

The console member 108 includes a first attachment wall 116, a console wall 120, a first connecting wall 124, a second connecting wall 128, and a second attachment wall 132. The first and second attachment walls 116 and 132 are mountable to the second wall 56 with appropriate fasteners (not depicted) employed at a number of third attachment points 136 and fourth attachment points 140, respectively. The side plates 112 are connectable with the console wall 120 at a number of fifth attachment points 144. While not expressly shown in FIGS. 9 and 10, the console wall 120 includes a hole formed therein that is substantially similar to the first and second holes 84 and 88 formed in the first and second walls 52 and 56, respectively.

It can be seen that the console wall 120 is oriented at an angle that is non-parallel with the second wall 56. It can further be seen that the console wall 120 protrudes outwardly away from the second wall 56, whereby the user interface 112 mounted thereon likewise protrudes outwardly from the second wall 56. It thus can be seen that by employing the console apparatus 104 for attaching the user interface 12 to the second wall 56, the user interface 12 is positioned at an angle that can be more readily observed and manipulated by a user or technician.

Figure 8:
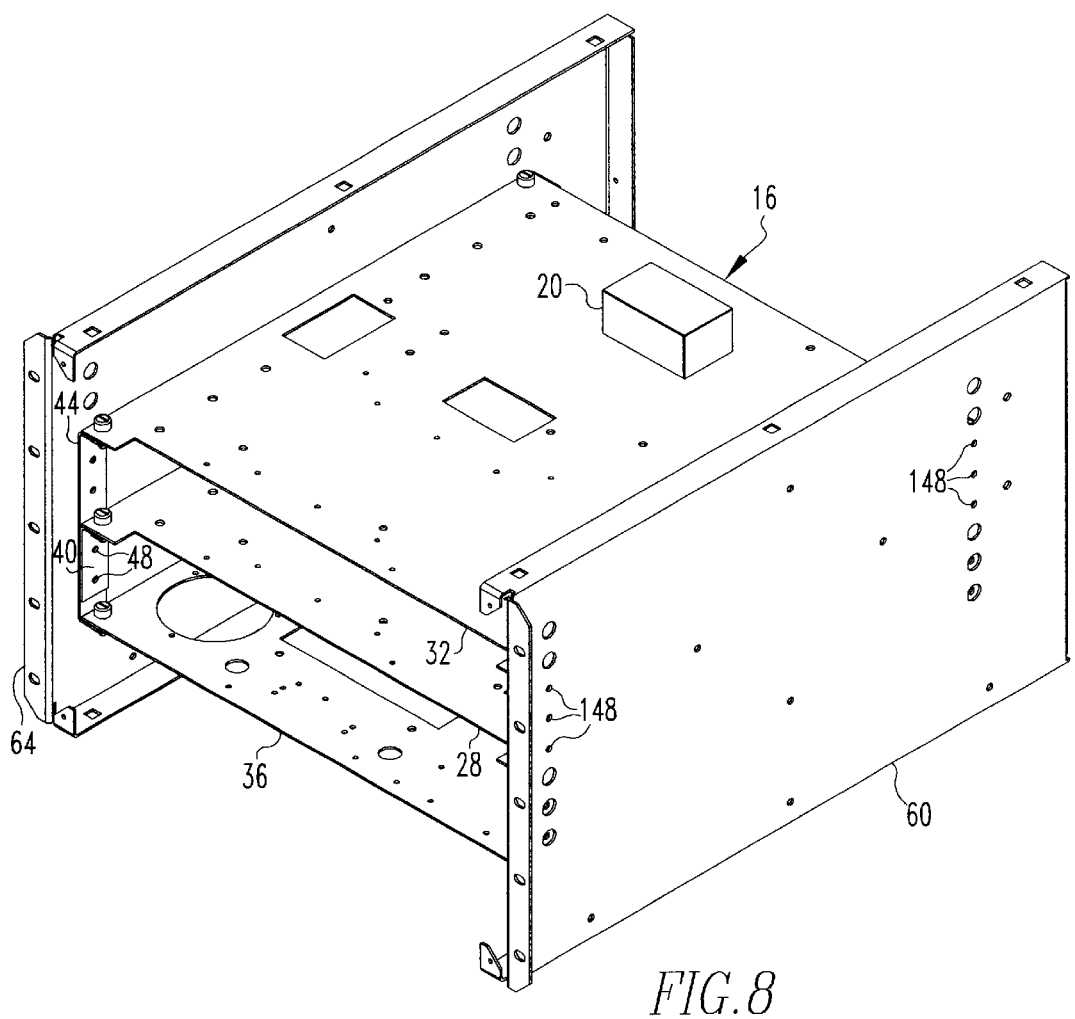
FIG. 8 is an isometric view of the internal support and electrical component of FIG. 3 mounted between a pair of walls of a housing of the enclosure apparatus of FIG. 1.

In assembling the enclosure apparatus 4, it can be seen that once the internal support 16 is assembled as shown in FIG. 3, the third walls 60 and 64 are connected with the second brackets 44 (FIG. 8) with a number of appropriate fasteners 150 (not shown in FIG. 8 but shown in FIGS. 1 and 2) applied at a number of sixth attachment points 148 (FIG. 8.) Each of the third walls 60 and 64 includes a number of relatively larger clearance holes 152 in the vicinity of the first brackets 40 to accommodate the heads of the fasteners (not shown) that may be employed in connecting the first brackets 40 with the second brackets 44. The clearance holes 152 permit the second brackets 44 to be disposed flush against the interior surfaces of the third walls 60 and 64 without interference by the heads of such fasteners (not shown) employed at the first fastening points 48.

After the third walls 60 and 64 have been attached to the internal support 16 in the fashion depicted in FIG. 8, the first, second, and fourth walls 52, 64, and 68, as well as the fifth wall (not shown) are mounted to the third walls 60 and 64. The cover plate 72 and the handles 76 and 80 are attached as indicated in FIGS. 1 and 2 depending upon whether the enclosure apparatus 4 is intended to be in a rack-mountable configuration or a wall-mountable configuration. If the enclosure apparatus 4 is intended to be in a wall-mountable configuration, the external supports 24 are additionally mounted to the third walls 60 and 64. The console apparatus 104 is employed as appropriate, and the user interface 12 mounted as appropriate.

It thus can be seen that the enclosure apparatus 4 can be easily converted between the rack-mountable configuration (FIG. 1) and the wall-mountable configuration (FIG. 2). The console apparatus 104 can additionally be employed if it is desired to orient the user interface 12 at an angle that is non-parallel with the second wall 56. While the enclosure apparatus 4 is depicted in FIGS. 1 and 2 as being an electrical excitation apparatus, it is noted that the enclosure apparatus 4 can be employed in conjunction with other equipment without departing from the concept of the present invention.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An enclosure apparatus for electrical equipment that is configurable for mounting in a plurality of orientations, the enclosure apparatus comprising:

a housing having an interior;

an internal support disposed at the interior of the housing; and a user interface;

the housing including a first wall and a second wall;

the user interface being alternatively securable to the first and second walls;

the user interface being secured to the first wall when the enclosure apparatus is configured to be mountable in a first orientation; and the user interface being secured to the second wall when the enclosure apparatus is configured to be mountable in a second orientation.

2. The enclosure apparatus as set forth in claim 1, in which the housing includes a handle and a third wall;

the handle being alternatively securable to the first wall and to at least one of the second and third walls;

the handle being secured to the first wall when the enclosure apparatus is configured to be mountable in the first orientation; and the handle being secured to one of the second and third walls when the enclosure apparatus is configured to be mountable in the second orientation.

3. The enclosure apparatus as set forth in claim 1, in which the housing includes a cover plate;

the first wall includes a first hole formed therein; and the second wall includes a second hole formed therein;

the cover plate being alternatively securable to the first wall to at least partially cover the first hole and to the second wall to at least partially cover the second hole;

the cover plate being secured to the second wall when the enclosure apparatus is configured to be mountable in the first orientation; and the cover plate being secured to the first wall when the enclosure apparatus is configured to be mountable in the second orientation.

4. The enclosure apparatus as set forth in claim 1, in which the housing includes a console member that is securable to the second wall when the enclosure apparatus is configured to be mountable in the second orientation;

the console member including a console wall oriented generally non-parallel with the second wall; and the user interface being mounted on the console wall when the enclosure apparatus is configured to be mountable in the second orientation.

5. The enclosure apparatus as set forth in claim 1, in which the enclosure apparatus is in a rack-mountable configuration when the enclosure apparatus is configured to be mountable in the first orientation; and the enclosure apparatus is in a wall-mountable configuration when the enclosure apparatus is configured to be mountable in the second orientation.

6. The enclosure apparatus as set forth in claim 2, in which the housing includes an external support;

the external support being mountable to at least one of the first, second, and third walls when the enclosure apparatus is configured to be mountable in one of the first and second orientations.

7. An enclosure apparatus for electrical equipment that is convertible between a plurality of mounting configurations, the enclosure apparatus comprising:

a housing having an interior;

an internal support mounted to the housing and disposed within the interior of the housing; and a user interface;

the housing including a first wall and a second wall;

the user interface being alternatively securable to the first and second walls;

the user interface being secured to the first wall when the enclosure apparatus is in a rack-mountable configuration; and the user interface being secured to the second wall when the enclosure apparatus is in a wall-mountable configuration.

8. The enclosure apparatus as set forth in claim 7, in which the housing includes a cover plate;

the first wall includes a first hole formed therein; and the second wall includes a second hole formed therein;

the cover plate being alternatively securable to the first wall to at least partially cover the first hole and to the second wall to at least partially cover the second hole;

the user interface being disposed over at least a portion of the first hole and the cover plate being secured to the second wall to at least partially cover the second hole when the enclosure apparatus is in the rack-mountable configuration; and the user interface being disposed over at least a portion of the second hole and the cover plate being secured to the first wall to at least partially cover the first hole when the enclosure apparatus is in the wall-mountable configuration.

9. The enclosure apparatus as set forth in claim 7, in which the housing includes a console member that is securable to the second wall when the enclosure apparatus is in the wall-mountable configuration;

the console member including a console wall oriented generally non-parallel with the second wall; and the user interface being mounted on the console wall when the console member is secured to the second wall.

10. The enclosure apparatus as set forth in claim 7, in which
the housing includes a pair of third walls; and
the internal support includes a first support plate, a second support plate, a plurality of first brackets, and a plurality of second brackets;
the first support plate being secured to the first brackets;
the second support plate being secured to the second brackets;
the first brackets being secured to the second brackets; and
the second brackets being secured to the third walls.

11. The enclosure apparatus as set forth in claim 8, in which
the housing includes a pair of handles and a pair of third walls;
the handles being alternatively securable to the first wall and to the pair of third walls;
the handles being secured to the first wall when the enclosure apparatus is in the rack-mountable configuration; and
the handles being secured to the third walls when the enclosure apparatus is in the wall-mountable configuration.

12. The enclosure apparatus as set forth in claim 10, in which
the third walls each include at least a first clearance hole formed therein in the vicinity of each first bracket.

13. The enclosure apparatus as set forth in claim 11, in which
the housing includes a pair of external supports;
the pair of external supports being mounted to the pair of third walls when the enclosure apparatus is in the wall-mountable configuration.

14. An excitation apparatus comprising:
a housing having an interior;
an internal support mounted to the housing and disposed within the interior of the housing;
a number of electrical components secured to the internal support; and
a user interface secured to the housing;
the housing including a first wall and a second wall;
the user interface being alternatively securable to the first and second walls;
the excitation apparatus being convertible between a rack-mountable configuration and a wall-mountable configuration;
the user interface being secured to the first wall when the excitation apparatus is in the rack-mountable configuration; and
the user interface being secured to the second wall when the excitation apparatus is in the wall-mountable configuration.

15. The excitation apparatus as set forth in claim 14, in which
the housing includes a cover plate;
the first wall includes a first hole formed therein; and
the second wall includes a second hole formed therein;
the cover plate being alternatively securable to the first wall to at least partially cover the first hole and to the second wall to at least partially cover the second hole;
the user interface extending across at least a portion of the first hole and the cover plate being secured to the second wall to at least partially cover the second hole when the excitation apparatus is in the rack-mountable configuration; and
the user interface extending across at least a portion of the second hole and the cover plate being secured to the first wall to at least partially cover the first hole when the excitation apparatus is in the wall-mountable configuration.

16. The excitation apparatus as set forth in claim 14, in which
the housing includes a console member that is securable to the second wall when the excitation apparatus is in the wall-mountable configuration;
the console member including a console wall that protrudes outwardly from the second wall when the console member is secured to the second wall; and
the user interface being mounted on the console wall when the console member is secured to the second wall.

17. The excitation apparatus as set forth in claim 14, in which the housing includes a pair of third walls opposed to one another; and
the internal support includes a first support plate, a pair of second support plates, a plurality of angled first brackets, and a plurality of U-shaped second brackets;
the first support plate being secured to the first brackets;
the second support plates being secured to opposite ends of the second brackets;
the first brackets being secured to the second brackets; and
the second brackets being secured to the third walls.

18. The excitation apparatus as set forth in claim 15, in which
the housing includes a pair of handles; and
the housing includes a pair of third walls opposed to one another;
the handles being alternatively securable to the first wall and to the pair of third walls;
the handles being secured to the first wall when the excitation apparatus is in the rack-mountable configuration; and
the handles being secured to the third walls when the excitation apparatus is in the wall-mountable configuration.

19. The excitation apparatus as set forth in claim 17, in which
the third walls each include at least a first clearance hole formed therein in the vicinity of each first bracket.

20. The excitation apparatus as set forth in claim 18, in which
the housing includes a pair of external supports;
the external supports being of an angled cross section; and
the pair of external supports being mounted to the pair of third walls when the excitation apparatus is in the wall-mountable configuration.

* * * * *